March 26, 1968 E. H. FLECKENSTEIN 3,374,809

LEAD ORIENTOR

Filed July 30, 1965 4 Sheets-Sheet 1

INVENTOR:
ELWIN H. FLECKENSTEIN,
BY Robert J. Mooney
HIS ATTORNEY.

March 26, 1968 E. H. FLECKENSTEIN 3,374,809

LEAD ORIENTOR

Filed July 30, 1965 4 Sheets-Sheet 2

INVENTOR:
ELWIN H. FLECKENSTEIN,
BY Robert J. Mooney
HIS ATTORNEY.

LEAD ORIENTOR

Filed July 30, 1965 4 Sheets-Sheet 3

INVENTOR:
ELWIN H. FLECKENSTEIN,

BY Robert J. Mooney
HIS ATTORNEY.

INVENTOR:
ELWIN H. FLECKENSTEIN,

BY Robert J. Mooney
HIS ATTORNEY.

United States Patent Office 3,374,809

Patented Mar. 26, 1968

3,374,809

LEAD ORIENTOR

Elwin H. Fleckenstein, Alden, N.Y., assignor to General Electric Company, a corporation of New York Filed July 30, 1965, Ser. No. 476,071

5 Claims. (Cl. 140—147)

ABSTRACT OF THE DISCLOSURE

In a mechanism for automatically straightening the leads of an electronic component such as a transistor and inserting the leads into a receptacle, e.g., inserting the leads into the apertures of a test socket, the components (transistors) are fed down a chute where the leads are preoriented by virtue of a slot in the chute, the leads are further preoriented by a comb-like lead spreader which has tapered fingers that advance between the root portions of the leads of the lower most transistor and the chute in order to spread the leads apart in a vertical direction and also by a ram which moves forward and gives the lead a slightly forward rake in the horizontal direction in advance of the ram. Orientation of the leads in a vertical or elevational sense is provided by a comb-like member which consists of a plurality of leaf-like or plate-like teeth which extend generally horizontally and have a vertical spacing such as to accommodate the respective leads of the transistors. Once the leads of the transistor are preoriented, a transfer arm which is mounted for oscillation about a vertical axis picks up the component and is rotated forward so that the leads are pulled through the comb and the leads are oriented in the vertical sense. In order to provide the proper orientation of the leads in a horizontal sense, a stop is provided at the end of the comb whereby the forward rake of the leads are intercepted by the stop and preferably a seating arm is rotated behind the leads in order positively to seat them against this stop and give the leads the desired orientation so that they may be inserted in a socket if desired. Preferably, the transfer arm holding the transistor is provided with an ejection means which moves the component forward is still the third direction of orientation either to insert the leads in a test socket or disposal bin.

The present invention relates to apparatus for orienting and inserting into receptacles the plural leads plural-leaded electronic components such as transistors and the like.

Electronic components such as transistors and the like are frequently provided with long slender metallic leads which are easily bent askew. In the handling or manipulating of such components for purposes such as testing, sorting, classifying and the like, the ease with which such long, slender leads can become bent out of shape, or tangle or jam in automatic equipment such as indexing or feeding or transferring mechanisms, has created many difficulties in the past. Frequently such difficulties have necessitated resorting to use of manual handling, a result which is quite undesirable from the standpoint of cost and the relatively low handling rates attainable manually.

Accordingly, one object of the present invention is to provide automatic equipment for orienting and inserting the leads of plural-leaded electronic components such as transistors into receptacles having lead-receiving openings, such as test sockets or the like.

Another object is to provide automatic high speed equipment for accepting, seriatim, plural-leaded electronic components having disoriented leads, and conforming such leads to a predetermined orientation.

Another object is to provide improved equipment of the foregoing character which is fully automatic, is capable of operating at high speeds of the order of several thousand components per hour, and is capable of performing dependably for long periods without attention or adjustment.

These and other objects of the present invention will be apparent from the following description taken in conjunction with the accompanying drawings wherein.

Figure 1:
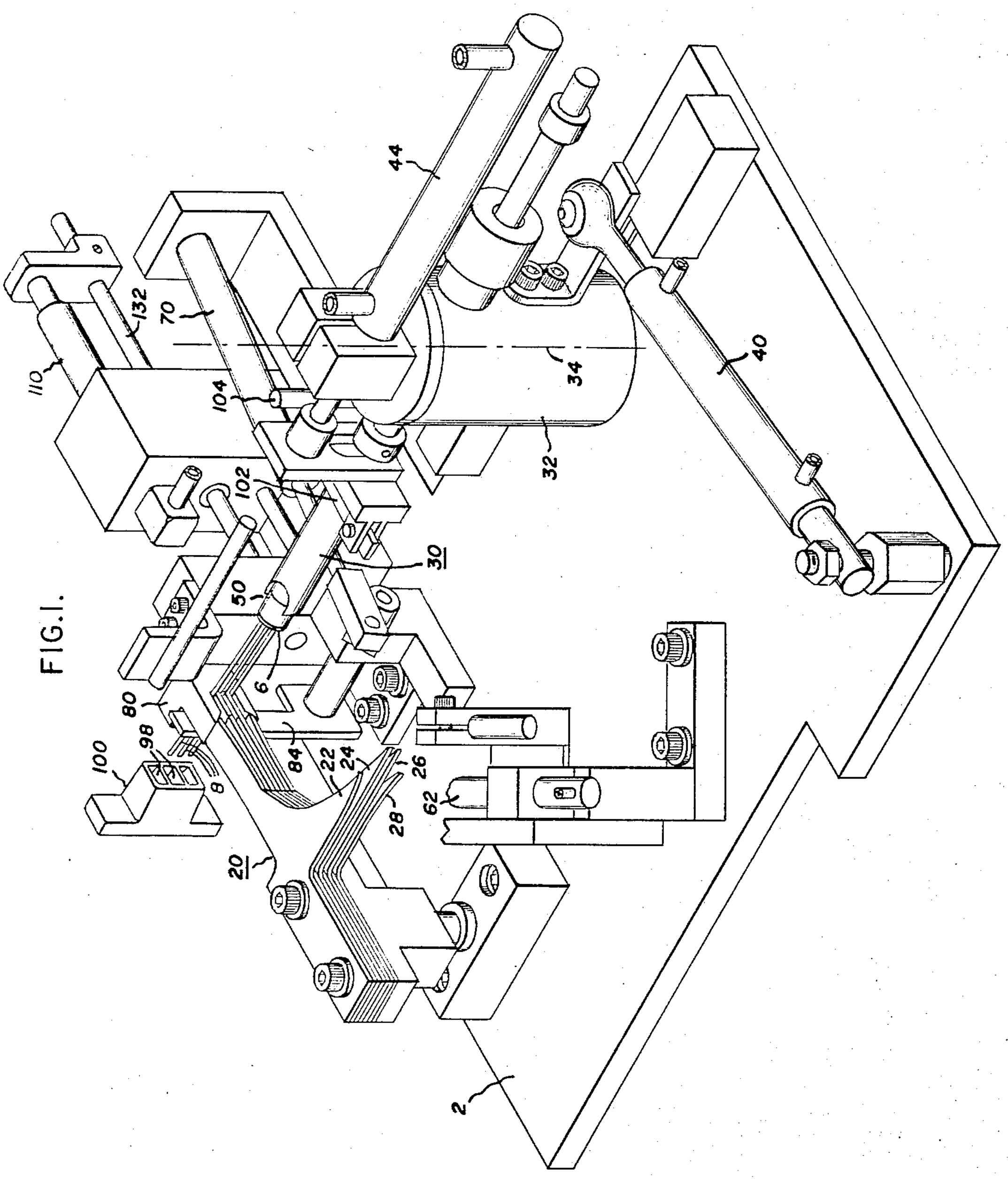
FIGURE 1 is a fragmentary perspective view of one form of orienting and inserting apparatus constructed according to my invention.
Figure 2:
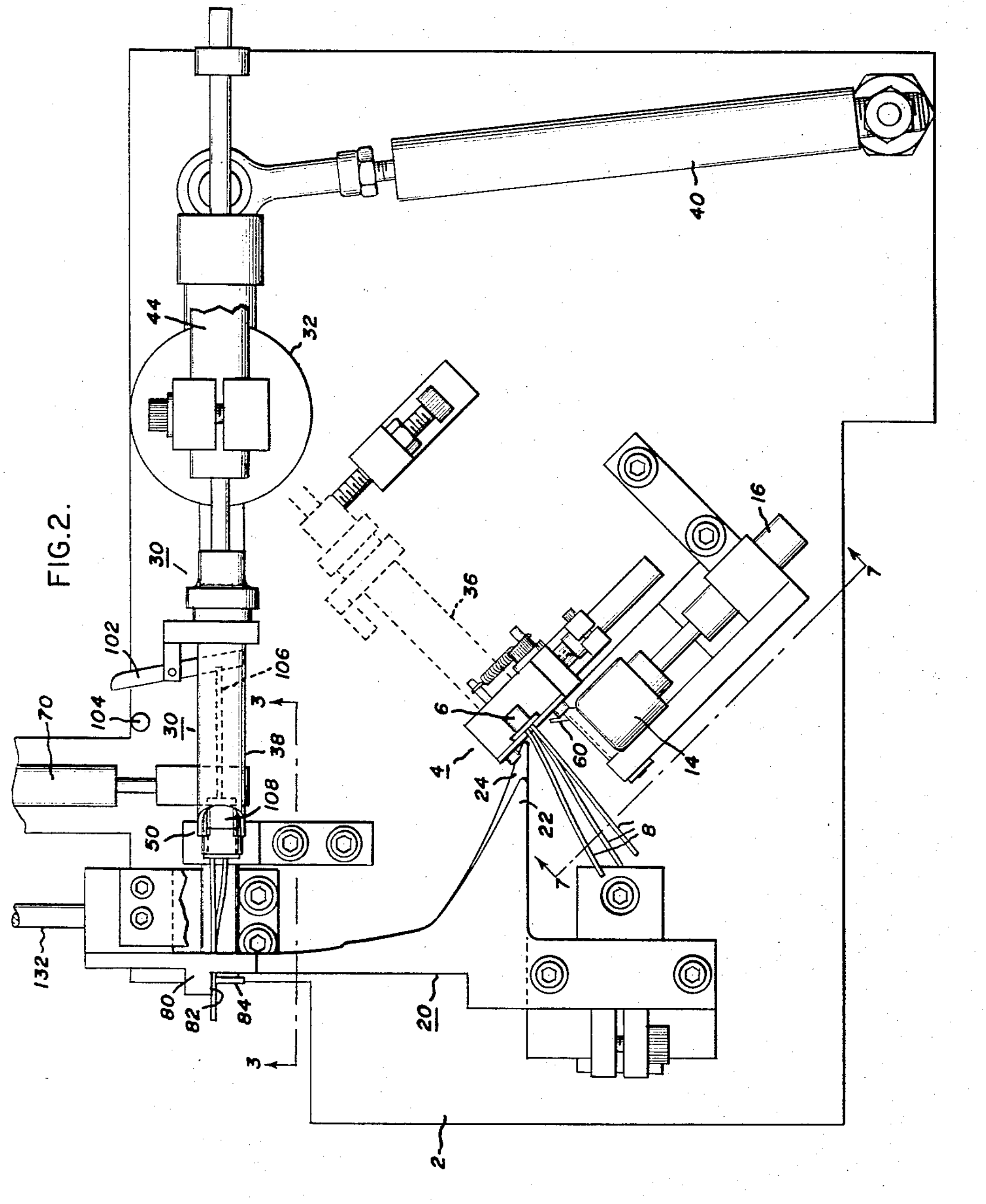
FIGURE 2 is a plan view of the apparatus shown in FIGURE 1, and including elements additional to those shown in FIGURE 1.

Referring to the drawing, and particularly to FIGURES 1 and 2 thereof, apparatus constructed in accordance with the present invention includes a base or table 2 on which is mounted an upstanding track or chute 4, of hollow rectangular cross-section, down which transistors or similar components 6 having plural leads 8 are fed by gravity or other suitable means. The chute includes a face-plate or cover 10 provided with a longitudinally extending central slot 12 through which the leads 8 of the transistors 6 project, the body or cap portion of the transistors being retained in the chute behind the face-plate 10. The caps of the transistors in the chute are maintained in proper or desired rotative orientation by engagement of the root portions of the leads 8 with the sides of the slot 12.

Figure 9:
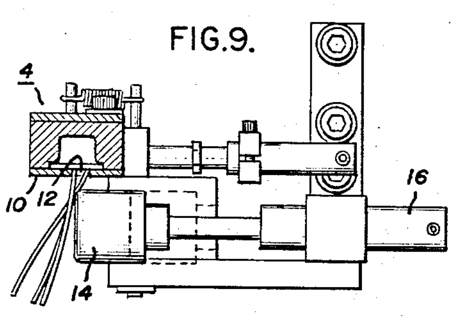
FIGURE 9 is a fragmentary sectional view of the apparatus of FIGURE 8, taken on the line 9—9 thereof.

To provide a coarse pre-orientation of the leads 8 relative to the face plate of the chute, and thereby facilitate proper engagement of remaining portions of the apparatus with the leads, a laterally reciprocable ram 14 is provided adjacent the chute at an intermediate point therealong. Ram 14 is reciprocated by an actuator 16 of any suitable type such as an air cylinder, which is in turn controlled by suitable solenoid valves and programmed switches, not shown, and serves to engage the leads of successive transistors traveling down the chute, and bend such leads toward the side of the chute away from the ram 14, as best shown in FIGURE 9. This gives the leads a slightly forward rake angle, in the horizontal direction of advance of ram 14, as best shown in FIGURE 2.

Adjacent the bottom of the chute is the entrance end of a comb 20 through which the leads of each transistor in turn are intended to be passed. The comb consists of a plurality of leaf-like or plate-like teeth 22, 24, 26, 28, one more in number than the number of leads 8 on each transistor 6. The teeth extend generally horizontally and have a vertical spacing such as to accommodate the respective leads 8 of a transistor 6 between respective adjacent pairs of said teeth. Thus, as the leads 8 are drawn through the comb 20, each lead is thereby constrained in a desired vertical or elevational orientation. The entrance ends of the teeth of comb 20 are situated opposite the root portions of the leads 8 of the lowermost transistor in chute 4, as best shown in FIGURE 2.

Figure 7:
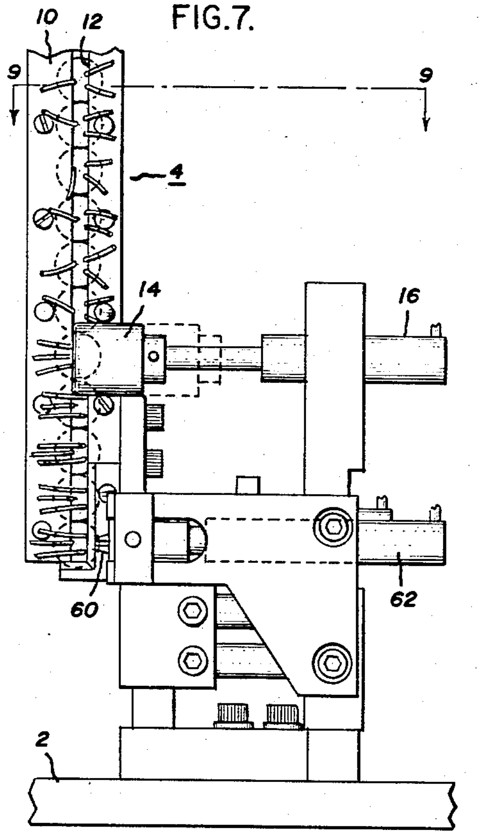
FIGURES 7 and 8 are enlarged front and rear views, respectively, of a portion of the apparatus of FIGURE 2.

A lead spreader 60, best shown in FIGURE 7 having tapered fingers in number one less than the number of leads 8 on each transistor, is arranged to be advanced by an actuator 62 between the root portions of the leads of the lowermost transistor in the chute 4. The lead spreader fingers serve to cam the leads apart in the vertical direction if they should be crossed upon each other, thereby properly aligning at least the root portions of the leads for jam-free entrance into comb 20. Likewise, to facilitate jam-free reception of the leads in the comb, the outer teeth 22, 28 of the comb are flared outward at their entrance end. This is best shown in FIGURE 1.

Figure 8:
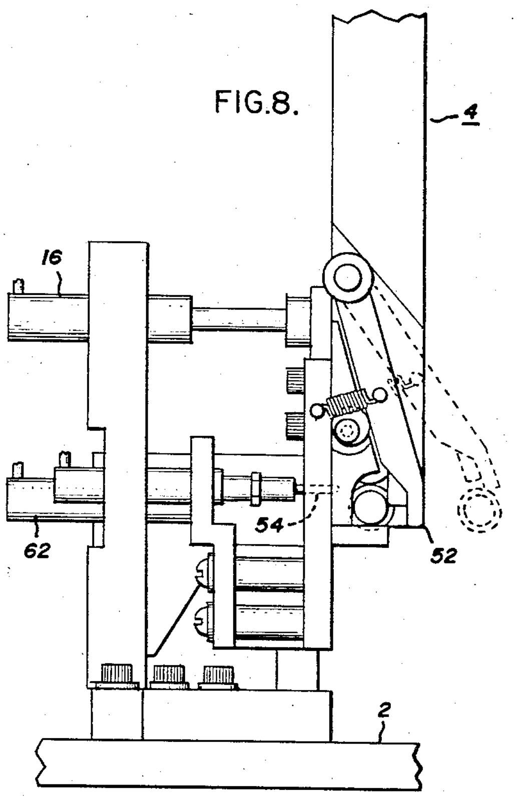

A reciprocable and oscillatable transfer arm 30 is mounted on a turret 32 for oscillation about a vertical axis 34 between a pick-up position 36 as shown by dotted lines in FIGURE 2, and a discharge portion 38 as shown by solid lines in FIGURE 2. Oscillation of the transfer arm is controlled by an actuator 40 shown as an air cylinder. Reciprocation of the transfer arm is provided by a similar actuator 44. At the free end of the transfer arm 30 is a collet 50 of resilient material such as resilient plastic or the like, dimensioned to be thrust axially snugly over the cap of the lowermost transistor 6 in the chute as the transfer arm 30, when in the pick-up position 36, is axially advanced by actuator 44. Thereupon, transfer arm 30 is rotated toward its discharge position 38, and the collet 50 cams open a spring-loaded door 52 at the bottom of the side of the chute 4, as shown in FIGURE 8, thus removing the lowermost transistor from the chute. Simultaneously, escapement pin 54, as shown in FIGURE 8, is advanced beneath the remaining transistors in chute 4 to prevent them from falling out of the chute.

The leads of the transistor carried in collet 50 are swept through comb 20 as the transfer arm 30 pivots to its discharge position 38, the teeth of the comb serving to confine and position the transistor leads in desired vertical or elevational orientation. The sides of the teeth of comb 20 are somewhat arcuate shaped, and roughly concentric with axis 34, as best shown in FIGURE 2, to facilitate free movement of leads 8 through the comb as transfer arm 30 is pivoted.

Situated at the outlet end of comb 20 in the path of leads moving through the comb is a stop 80 having a vertically extending reference surface 82 against which the respective leads are seated when the transfer arm reaches its discharge position. The stop 80 thus serves to determine or fix the horizontal or azimuthal reference position of the transistor leads. To insure proper seating of the leads in predetermined fully oriented position against the reference surface of the stop 80, a rotatable seating arm 84 controlled by actuator 70 is arranged to swing in behind the leads as they approach the stop, and the seating arm 84 thereby presses the leads against the vertical reference surface 82 of the stop, as best shown in FIGURE 1 and FIGURE 2. The forward rake angle imparted to the leads 8 by ram 14 insures gathering in by the seating arm 84 of all of the leads of a transistor adjacent stop 80, so that all such leads can be positively seated by the seating arm 84 against stop 80.

Figures 3, 4A, 4B, 4C:
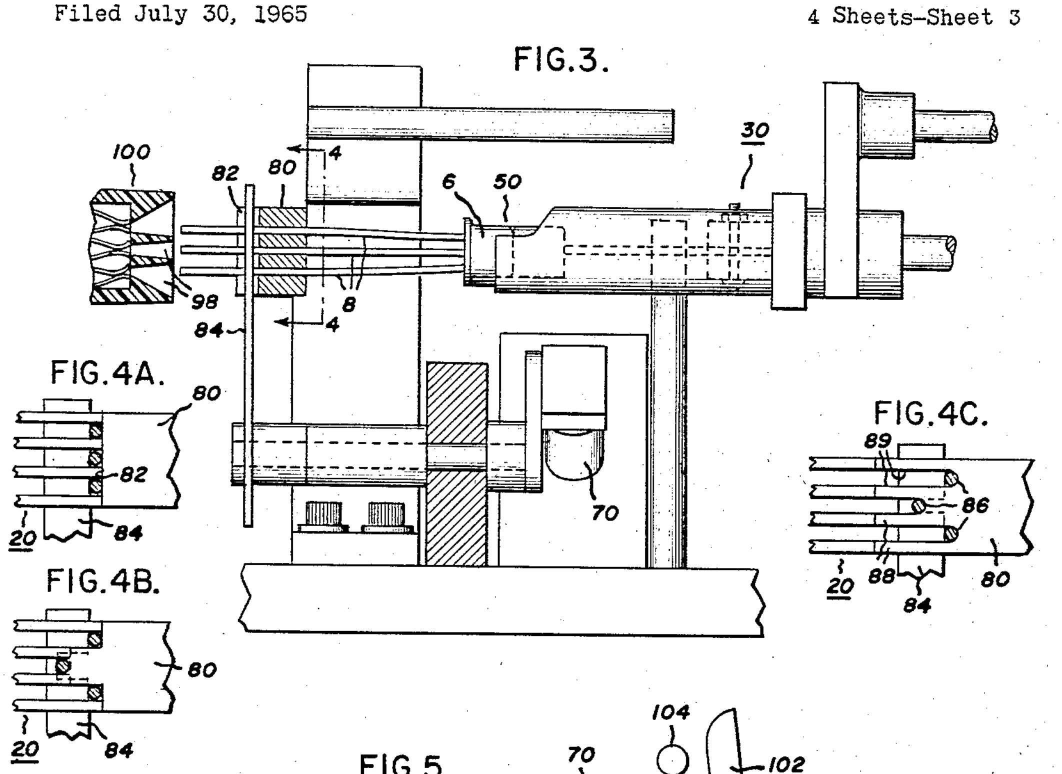
FIGURE 3 is an enlarged fragmentary sectional view of a portion of the apparatus shown in FIGURE 1.
FIGURES 4A, 4B and 4C are enlarged fragmentary sectional views of alternative embodiments of a portion of the apparatus shown in FIGURE 3, taken on line 4—4 of FIGURE 3.
Figure 5:
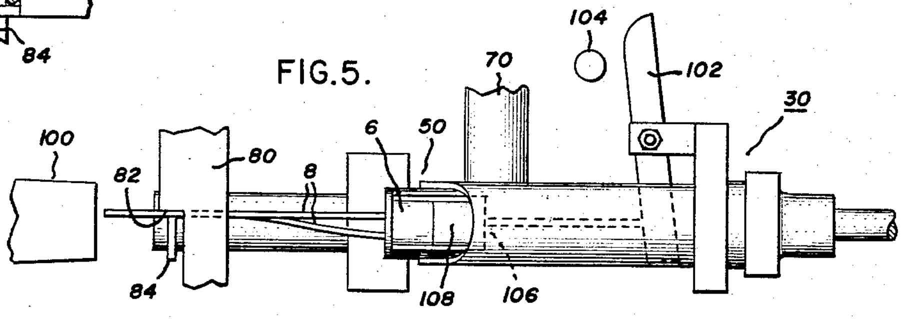
FIGURES 5, 6 and 6A are enlarged fragmentary views of a portion of the apparatus of FIGURE 2, before and after expulsion of a component from the transfer means thereof, FIGURE 6A being to a reduced scale.
Figure 11:
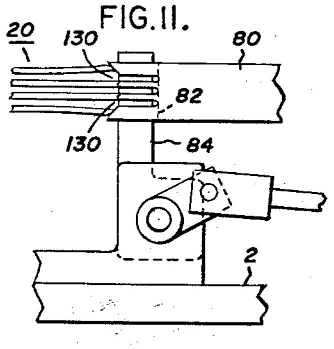
Figure 12:
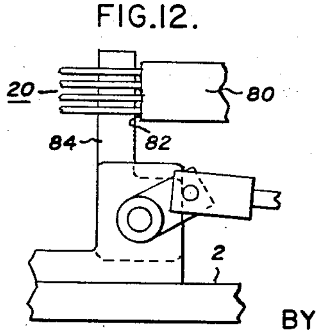

The stop 80 may provide a vertical reference of various configurations, as desired. The form of stop 80 shown in FIGURE 4A and FIGURE 12 has a single vertical lead-engaging surface 82 serving to provide orientation of the several leads of each transistor in a single vertical plane, and hence with a single horizontal or azimuthal direction. With the stop 80 of FIGURE 4A, the vertical or elevational orientation of the leads is provided exclusively by the teeth of the comb 20. Alternatively, however, the stop 80 may have a different lead-engaging reference surface for each lead, and these several reference surfaces may be arranged in any desired configuration complementary to a desired orientation of the leads in the horizontal direction, such as the stepped configuration shown in FIGURE 4B wherein the leads have a triangular relationship in final orientation. Also, final orientation of the leads in both the vertical as well as horizontal coordinates may be accomplished by a stop such as shown in FIGURES 4C and 11. The stop of FIGURE 4C is provided with vertical reference surfaces 86 (one for each lead), and also has fingers 88 serving as a continuation of the teeth of the comb 20 and providing horizontal reference surfaces 89 (one pair confining each lead). In the latter event, the fingers of the stop may be faired smoothly into the ends of the teeth of the comb, for example, by a tongue and groove arrangement as best shown at 130 in FIGURE 11.

Figure 6:
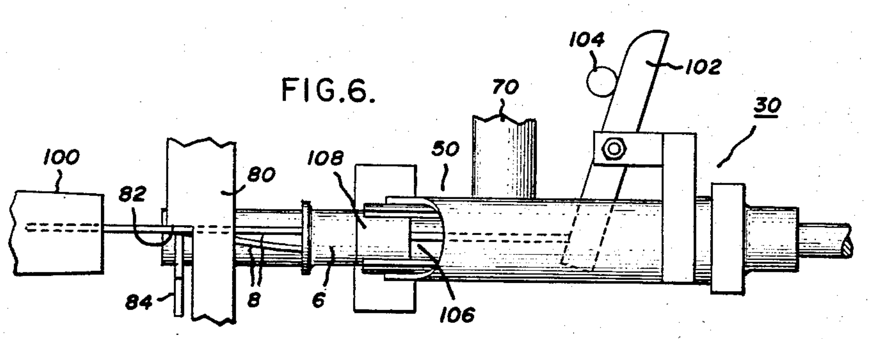
Figure 6A:
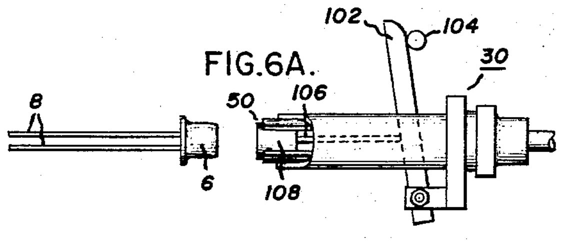

Once the leads of the transistor held by collet 50 are in the predetermined oriented position as shown in FIGURE 2, properly oriented vertncally as determined by the teeth of the comb 20 (or fingers 88 of stop 80), and properly oriented horizontally as determined by the vertical reference surface or surfaces of the stop 80, the leads 8 may then be thrust axially into respective lead receiving openings 98 of a confronting receptacle 100 by an axial advancement of the transfer arm 30 under control of actuator 44. During the course of such axial advancement, an ejector lever 102 carried by the transfer arm strikes a stationary pin 104, axially advancing a plunger 106 fitted with an ejector 108 which expels the cap of the transistor from collet 50 and inserts the leads 8 into the receptacle 100. Alternatively, if it is not desired to eject the transistor cap from the collet at this stage, the action of the ejector 108 may be omitted as by removing the ejector lever 102 or the stationary pin 104. As another alternative, the ejector 108 can be programmed to expel the transistor from collet 50 at any desired point on the axial return stroke of transfer arm 30, by changing the pivot point of lever 102 to the opposite side of arm 30 from pin 104, as best shown in FIGURE 6A.

Figure 10:
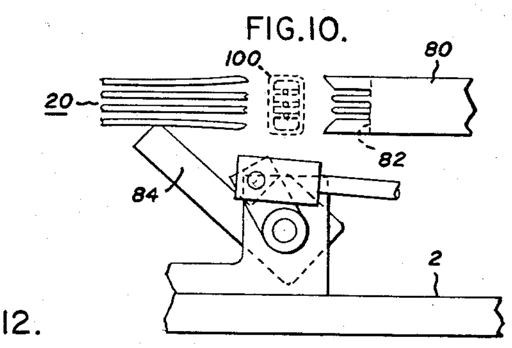
FIGURES 10, 11 and 12 are enlarged views of alternative embodiments of portions of the structure of FIGURE 2.

Should it be desired that the receptacle 100 be movable from its lead-receiving position with the leads remaining inserted in it, as, for example, when it is desired to insert a plurality of transistors successively into a series of receptacles successively indexed into lead-receiving position, the stop 80 may be made retractable from its reference position, as shown in FIGURE 11, to a withdrawn position as shown in FIGURE 10 such that it does not interfere with the leads during indexing of a loaded receptacle. Such retraction of stop 80 may be accomplished, for example, by an actuator 110 coupled to stop 80 by rod 132. Thereupon the receptacle 100, with the leads of a transistor inserted therein, may be indexed away, taking the inserted transistor with it.

Thus it will be apparent that the apparatus above described transfers components such as transistors from supply chute 4, into which they may be loaded by any suitable means, to a reference station in which the leads are fully oriented and positioned in two mutually orthogonal directions, e.g., vertically or elevationally and horizontally or azimuthally. The apparatus further inserts the oriented leads into desired receptacles, or may, if such insertion is not desired, simply support the leads in fully oriented position for performance of one or more additional work operations upon them.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. Means for inserting the plural leads of a plural-leaded electronic component such as a transistor into plural respective openings of a receptacle comprising a comb having a plurality of leaf-like teeth spaced in a first direction, a holder for supporting an electronic component with its leads projecting therefrom and movable between a loading station at the entrance end of said teeth and a discharge station at the outlet end of said teeth, means for loading the holder with an electronic component, lead-bending means associated with said loading means for bending said leads in the direction of the comb, lead spreader means adjacent said loading station and engageable with the root portions of leads of a component in said holder to cam said root portions into positions of jam-free entrance between the teeth of said comb, means for moving said holder relative to said comb to draw the leads projecting from the holder through said comb and cam said leads between respective adjacent pairs of said teeth, whereby said leads are located in parallel planes spaced in said first direction, stop means arranged in the path of leads drawn through said comb, said stop means having reference surfaces against which said leads are adapted to abut for determining the position of said leads intercepted thereby in a second direction or thogonal to said first direction, whereby said leads are oriented at said discharge station in two mutually orthogonal directions for insertion into a receptacle.

2. Means for inserting the plural leads of a plural-leaded electronic component such as a transistor into plural respective openings of a receptacle comprising a comb having a plurality of leaf-like teeth spaced in a first direction, a holder for supporting an electronic component with its leads projecting therefrom and movable between a loading station at the entrance end of said teeth and a discharge station at the outlet end of said teeth, means for loading the holder with an electronic component, lead-bending means associated with said loading means for bending said leads in the direction of the comb, lead spreader means adjacent said loading station and engageable with the root portions of leads of a component in said holder to cam said root portions into positions of jam-free entrance between the teeth of said comb, means for moving said holder relative to said comb to draw the leads projecting from the holder through said comb and cam said leads between respective adjacent pairs of said teeth, whereby said leads are located in parallel planes spaced in said first direction, stop means arranged in the path of leads drawn through said comb, said stop means having reference surfaces against which said leads are adapted to abut for determining the position of said leads intercepted thereby in a second direction orthogonal to said first direction, and movable seating means for urging said leads into seated relation against said reference surfaces after interception of said leads by said stop means, whereby said leads are oriented at said discharge station in two mutually orthogonal directions for insertion into a receptacle.

3. Apparatus for orienting and inserting into a receptacle the plural leads of a transistor comprising a chute along which transistors are feed to a loading station station, a holder engageable with a transistor at said loading station and movable through a predetermined path to a discharge station, a comb in said path having teeth spaced in a first orthogonal direction and engageable with leads of a transistor moved therealong by said holder for camming said leads to a predetermined orientation in said first orthogonal direction, a stop in said path having reference surfaces extending in a second direction orthogonal to said first direction, means for pressing said leads against displacing said holder at said discharge station in a third direction orthogonal to said first and second directions, whereby leads oriented in first and second directions are inserted into apertures in a receptacle spaced from said discharge station in said third direction.

4. Means for inserting the plural leads of a plural-leaded electronic component such as a transistor into plural respective openings of a receptacle comprising a comb having a plurality of leaf-like teeth spaced in a first direction, a holder for supporting an electronic component with its leads projecting therefrom and movable between a loading station at the entrance end of said teeth and a discharge station at the outlet end of said teeth, means for loading the holder with an electronic component lead bending means associated with said loading means for bending said leads in the direction of the comb, lead spreader means adjacent said loading station and engageable with the root portions of leads of a component in said holder to cam said root portions into positions of jam-free entrance between the teeth of said comb, means for moving said holder relative to said comb to draw the leads projecting from the holder through said comb and cam said leads between respective adjacent pairs of said teeth, whereby said leads are located in parallel planes spaced in said first direction, stop means arranged in the path of leads drawn through said comb, said stop means having reference surfaces against which said leads are adapted to abut for determining the position of said leads intercepted thereby in a second direction orthogonal to said first direction, and means for axially displacing said holder at said discharge station in a third direction orthogonal to said first and second directions whereby said leads oriented at said discharge station in two mutually orthogonal directions are inserted into apertures in a receptacle spaced from said discharge station in said third direction.

5. Means for inserting the plural leads of a plural-leaded electronic component such as a transistor into plural respective openings of a receptacle comprising a comb having a plurality of leaf-like teeth spaced in a first direction, a holder for supporting a electronic component with its leads projecting therefrom and movable between a loading station at the entrance end of said teeth and a discharge station at the outlet end of said teeth, means for loading the holder with an electronic component, lead-bending means associated with said loading means for bending said leads in the direction of the comb, lead spreader means adjacent said loading station and engageable with the root portions of leads of a component in said holder to cam said root portions into positions of jam-free entrance between the teeth of said comb, means for moving said holder relative to said comb to draw the leads projecting from the holder through said comb and cam said leads between respective adjacent pairs of said teeth, whereby said leads are located in parallel planes spaced in said first direction, stop means arranged in the path of leads drawn through said comb, said stop means having reference surfaces against which said leads are adapted to abut for determining the position of said leads intercepted thereby in a second direction orthogonal to said first direction, whereby said leads are oriented at said discharge station in two mutually orthogonal directions for insertion into a receptacle, and means for expelling the component from said holder at said discharge station.

References Cited

UNITED STATES PATENTS

| | | | |
|---|---|---|---|
| 3,007,291 | 11/1961 | Jordan et al. | 53—200 |
| 3,286,740 | 11/1966 | Fuchs et al. | 140—147 |
| 3,195,584 | 7/1965 | Zimmerman et al. | 140—147 |
| 3,220,443 | 11/1965 | Smith et al. | 140—147 |
| 3,225,797 | 12/1965 | Stoody | 140—147 |

OTHER REFERENCES

R. D. Essert, Transistor Lead Straightener, August 1959, pp. 28–29 (IBM Technical Disclosure Bulletin).

CHARLES W. LANHAM, *Primary Examiner.*

E. M. COMBS, *Assistant Examiner.*